United States Patent [19]

Tiemann

[11] Patent Number: 5,565,867
[45] Date of Patent: Oct. 15, 1996

[54] DISTRIBUTED ANALOG TO DIGITAL CONVERTER WITH OPTICAL LINKS

[75] Inventor: Jerome J. Tiemann, Schenectady, N.Y.

[73] Assignee: General Electric Company, Schenectady, N.Y.

[21] Appl. No.: 518,004

[22] Filed: Aug. 23, 1995

[51] Int. Cl.$^6$ ........................................ H03M 3/00
[52] U.S. Cl. ........................ 341/143; 341/137; 341/155; 128/660.01; 128/661.01
[58] Field of Search ............................ 341/143, 155, 341/180, 137; 359/123, 124, 125, 133, 145, 150, 173; 250/568; 128/660, 661

[56] References Cited

U.S. PATENT DOCUMENTS

| Re. 34,663 | 7/1994 | Seale | 128/774 |
|---|---|---|---|
| 4,641,371 | 2/1987 | Shutterly | 455/601 |
| 5,010,346 | 4/1991 | Hamilton et al. | 341/137 |
| 5,065,157 | 11/1991 | Ribner et al. | 341/143 |
| 5,084,702 | 1/1992 | Ribner | 341/143 |
| 5,103,229 | 4/1992 | Ribner | 341/143 |
| 5,148,166 | 9/1992 | Ribner | 341/143 |
| 5,181,032 | 1/1993 | Ribner | 341/143 |
| 5,187,482 | 2/1993 | Tiemann et al. | 341/143 |
| 5,241,310 | 8/1993 | Tiemann | 341/143 |
| 5,257,124 | 10/1993 | Glaab et al. | 359/124 |
| 5,283,578 | 2/1994 | Ribner et al. | 341/143 |
| 5,317,440 | 5/1994 | Hsu | 359/113 |

Primary Examiner—Jeffrey A. Gaffin
Assistant Examiner—Jason H. Vick
Attorney, Agent, or Firm—Marvin Snyder

[57] ABSTRACT

A distributed delta-sigma analog-to-digital (A/D) converter is partitioned between an ultrasonic probe and an imaging console which are coupled to each other by optical links. The ultrasonic probe houses an integrator for receiving an analog input signal and generating an integrated analog output signal. The integrated output signal is supplied to a light emitting diode for generating a light beam. The probe also houses photoconductive switches for coupling positive and negative reference voltages to a summing node of the integrator. The imaging console houses a photodiode for receiving the light beam via a fiber optic cable and converting the light beam to an analog electrical signal which is later converted to a digital signal. A feedback loop includes an internal A/D converter in the console that is coupled to the photoconductive switches via LED-generated light beams passed through other fiber optic cabling.

13 Claims, 3 Drawing Sheets

DISTRIBUTED ANALOG TO DIGITAL CONVERTER WITH OPTICAL LINKS

BACKGROUND OF THE INVENTION

1. Field of the Invention

This invention relates to delta-sigma analog-to-digital (A/D) converters for imaging systems and, more particularly, to apparatus that partitions an A/D converter of an ultrasonic imaging system, with one portion located in the sensor or transducer probe and the other in the signal processor or imaging console.

2. Description of the Related Art

An ultrasonic imaging system requires a large array of ultrasonic transducers contained within a hand-held probe to provide steering and focusing of the ultrasonic beam. The hand-held probe is placed in contact with the patient's skin and must be capable of being manipulated freely by the operator. Each transducer receives, from the object being examined, a high frequency signal that must be transmitted back to the host electronics system or imaging console for signal processing.

The probe constraints, namely a large number of transducers combined with ease of maneuverability, require that cabling which connects the probe to a console be small and flexible and that total power dissipated in the probe be kept as low as possible.

At the same time, there are advantages to converting the sensor output signals to digital form before they are processed. This creates a need for an analog-to-digital (A/D) converter architecture exhibiting the least possible power dissipation at the sensor location.

Moreover, there exists a constraint on the dynamic range and preservation of accuracy of the signals from each of the transducer elements so that accurate beamforming can be accomplished. Active imaging systems such as radar, sonar, and ultrasound systems, however, require very large dynamic ranges since reflections from nearby objects are generally of much larger amplitude than reflections from objects further away. These various constraints discussed above become incompatible when the probe contains more than about 100 transducers.

In light of the foregoing, there exists a need for A/D converter architecture that preserves the accuracy and dynamic range of a large number of signals conducted in close proximity in a small, flexible cable, with little, power dissipation at the probe head.

There also exists a need for A/D converter architecture that does not require critical component matching while using optical links that have relatively low dynamic range in which almost all of the power dissipation takes place at the remote end of the optical links.

There exists a further need for A/D converter architecture that has a dynamic range at a signal source that is substantially larger than that of a signal-carrying link that communicates with a sensor.

SUMMARY OF THE INVENTION

Briefly, in accordance with a preferred embodiment of the invention, an ultrasonic imaging system includes a sensor or transducer probe and a signal processor or imaging console. An A/D converter, such as a conventional delta-sigma A/D converter, is also provided and is selectively partitioned between the probe head and signal processor to overcome the aforementioned difficulties experienced in the prior art.

In addition, the converter architecture of the invention does not require any highly accurate analog signal to be passed between the two portions of the imaging system, allowing the two portions to be easily linked together with fiber-optic links of relatively low dynamic range.

The ultrasonic imaging system of the invention includes an ultrasonic probe, an imaging console, and a pair of fiber optic cables linking the probe to the console. The probe comprises an integrator coupled to receive an analog input signal and generate an integrated analog output signal, a first light source responsive to the integrated analog output signal for converting the integrated analog output signal to a first light beam, and circuitry for controllably applying reference voltages to an input of the integrator. The console comprises a first light detector for receiving the first light beam via a first fiber optic cable and for convening the first light beam to an analog electrical signal, and an A/D converter coupled to the first light detector for receiving and converting to a digital signal the analog electrical signal produced by the first light detector. A feedback loop comprising second and third light sources responsive to the digital signal are optically coupled to corresponding second and third fiber optic cables for controlling the reference voltages applied to the integrator.

In one embodiment of the invention the circuitry for controllably applying reference voltages to an input of the integrator includes first and second photoconductive switches respectively connected to a positive and a negative voltage source. In another embodiment, the circuitry for controllably applying reference voltages to the integrator includes a photoconductive switch and a resistor respectively connected to a positive and a negative voltage source.

BRIEF OF THE DRAWINGS

The features of the invention believed to be novel are set forth in the appended claims. The invention, however, together with further objects and advantages thereof, may best be understood by reference to the following description taken in conjunction with the accompanying drawing(s) in which:

to

DETAILED DESCRIPTION OF THE INVENTION

Figure 1:
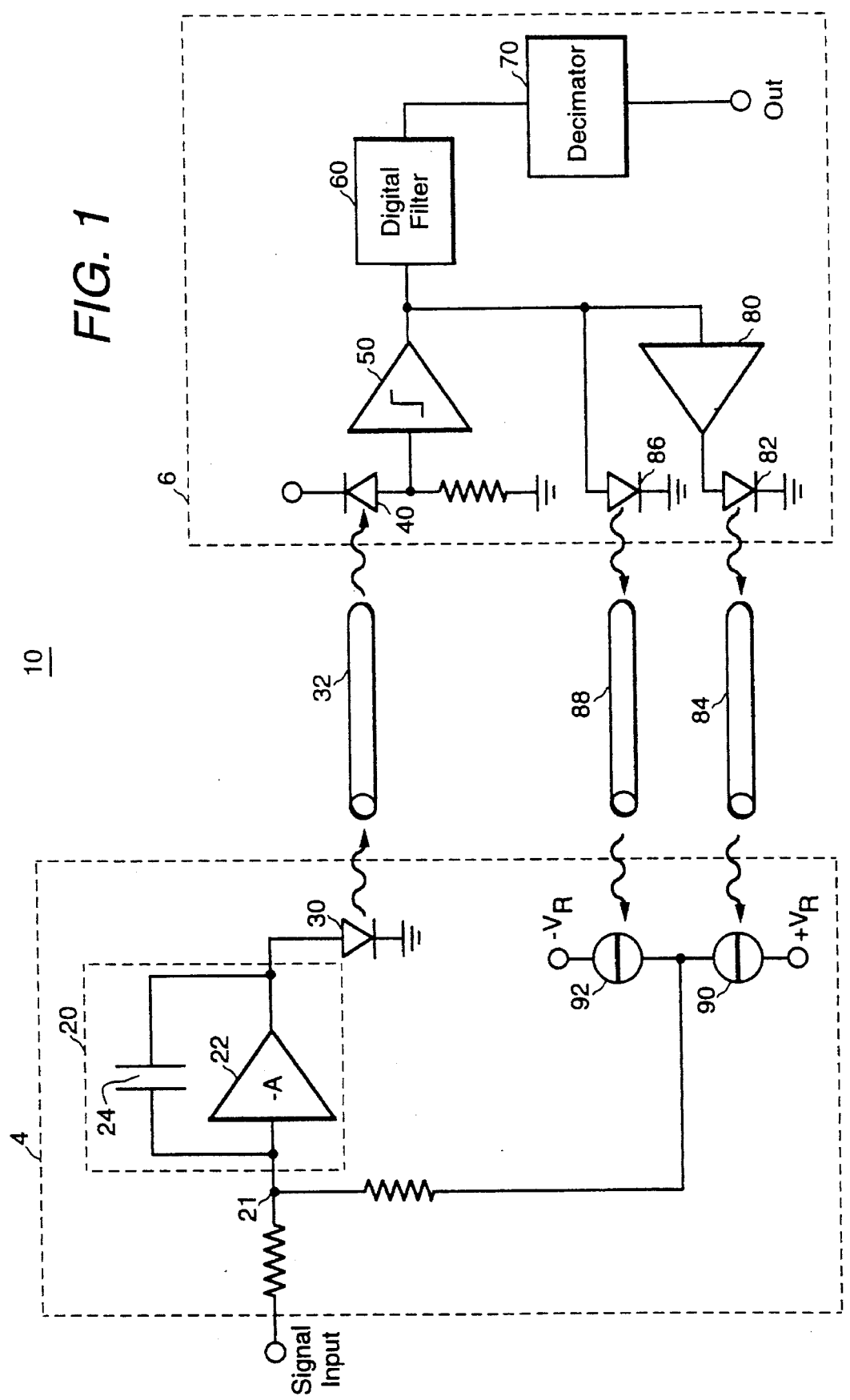
FIG. 1 is a schematic diagram of an A/D converter system having a distributed A/D converter architecture according to the present invention.

FIG. 1 illustrates a distributed A/D converter 10 in accordance with the invention. It Will be understood by those skilled in the relevant art that the invention may utilize any conventional delta-sigma A/D converter architecture. In addition, although any conventional noise-shaping loop may be utilized, a first order (single integrator) delta-sigma A/D converter arrangement is shown for simplicity Of illustration and explanation; however, a delta-sigma converter arrangement of any order may be used in practicing the invention.

FIG. 1 depicts the basic arrangement of a system where the components in a probe head 4 are an integrator 20, a modulatable light source 30 or an electro-optical light modulator of modest accuracy, an accurate reference voltage $\pm V_R$, and one or more optically activated switches, such as photoconductors 90 and 92. The remaining components shown in FIG. 1, i.e., the A/D converter, additional light generating means 82, 86, a digital filter 60, and a decimator 70, are all located in an imaging console 6.

As shown in FIG. 1, probe head 4 houses an analog integrator 20 comprised of an operational amplifier or "opamp" 22 coupled in parallel with a capacitor 24. The analog integrator balances the average of the input signal and the average of the digital bit signal received from a feedback loop as discussed further, below.

The integrated analog output signal from the integrator is supplied to a light source which, by way of example and not by limitation, may be a light emitting diode (LED) 30. LED 30 converts the integrated analog output signal to a light beam directed onto a light responsive detector 40 in imaging console 6 via a fiber optic link 32. Detector 40 converts the light beam back into an analog electrical signal. A suitable light responsive detector 40 would include, for example, photodiodes or other equivalent photodetecting devices.

An A/D converter, such as a comparator 50, receives the analog electrical signal from light responsive detector 40 and converts the analog electrical signal to a digital signal. High resolution analog-to-digital signal conversion can be achieved with lower resolution components through the use of oversampled interpolative (or delta-sigma) modulation followed by digital low pass filtering and decimation. Oversampling refers to operation of the modulator at a rate many times greater than the Nyquist rate, whereas decimation refers to reduction of the clock rate by periodic deletion of samples.

A digital filter 60 is coupled to receive and filter the digital output signal of A/D converter 50, so as to filter the high frequency quantization noise above the signal bandwidth. A decimator 70 receives the filtered digital output signal of digital filter 60 and samples the filtered digital output signal at a compressed rate.

Delta-sigma A/D converters typically employ an internal A/D converter of modest resolution and a complementary digital-to-analog (D/A) converter in a feedback loop. The feedback loop increases the accuracy of the delta-sigma A/D converter in a manner consistent with the high speed operation afforded by the internal A/D converter. In theory, any error in linearity or resolution caused by the D/A converter is effectively added to the input signal and appears at the output of the internal A/D converter without attenuation.

FIG. 1 depicts a feedback loop comprising comparator 50, which serves as an internal one-bit A/D converter, optically connected via fiber optic links 84 and 88 to two photoconductor switches 90 and 92 in the probe head, which serve as one-bit D/A converters. To obtain wider bandwidths, multi-bit versions of the D/A and internal A/D converters can be used, and are within the scope of this invention. Positive ($V_R$) and negative ($-V_R$) reference voltages are coupled to the input of integrator 20 via photoconductive switches 90 and 92, respectively, for controllably applying the reference voltage signals to the integrator.

An LED 82, or other comparable light generating means in imaging console 6, is coupled to receive the digital signal from comparator 50 and generate a light beam for transfer, via fiber optic link 84, to photoconductive switch 90 in probe head 4. Another LED 86, or other comparable light generating means in the imaging console, is also coupled to receive the digital output signal of comparator 50 and generate a light beam for transfer, via fiber optic link 88, to photoconductive switch 92 in probe head 4.

When switch 90 is actuated, positive voltage reference $V_R$ is applied to a summing node 21 of integrator 20. When switch 92 is actuated, negative voltage reference $-V_R$ is fed to summing node 21 of integrator 20. The switches are controlled by inverter 80, which controls when one or the other of LEDs 82 and 86 in the feedback path is dark.

In the illustrated embodiment of FIG. 1, therefore, the feedback loop carries the digital output signal of comparator 50 to integrator 20 through a fiber-optic link comprising two fibers: one to increment integrating capacitor 24, and one to decrement integrating capacitor 24.

Since the reference voltages are generated on the far end of the feedback loop, and the fiber-optic signal is used merely to activate a photoconducting switch; no accuracy penalty is imposed by use of the fiberoptic link. In fact, the accuracy of photoconductor switches 90 and 92 may be an improvement over that of conventional one-bit D/A converters, because there is no stray signal pick-up via the optical fibers.

Analog integrator 20 balances the average of the input signal and the average of the digital signal received from the feedback loop. When these averages become unequal, the integrator output signal changes from its nominal value, and A/D converter 50 must detect this change. Because any errors are subsequently corrected, however, transient discrepancies and integrator output noise have little effect on the over-all performance of the delta-sigma A/D converter.

For this same reason, photon noise associated with the LEDs and photodiode, and end-to-end non-linearity of the optical link between the integrator 20 output and the comparator 50 input, also have little effect. Thus, despite the relatively low dynamic range provided by an optical link, the circuit architecture of FIG. 1 has as much dynamic range as it would have if electrical connections were employed between the analog signal input portion and the digital feedback signal receiving portion.

Figure 2:
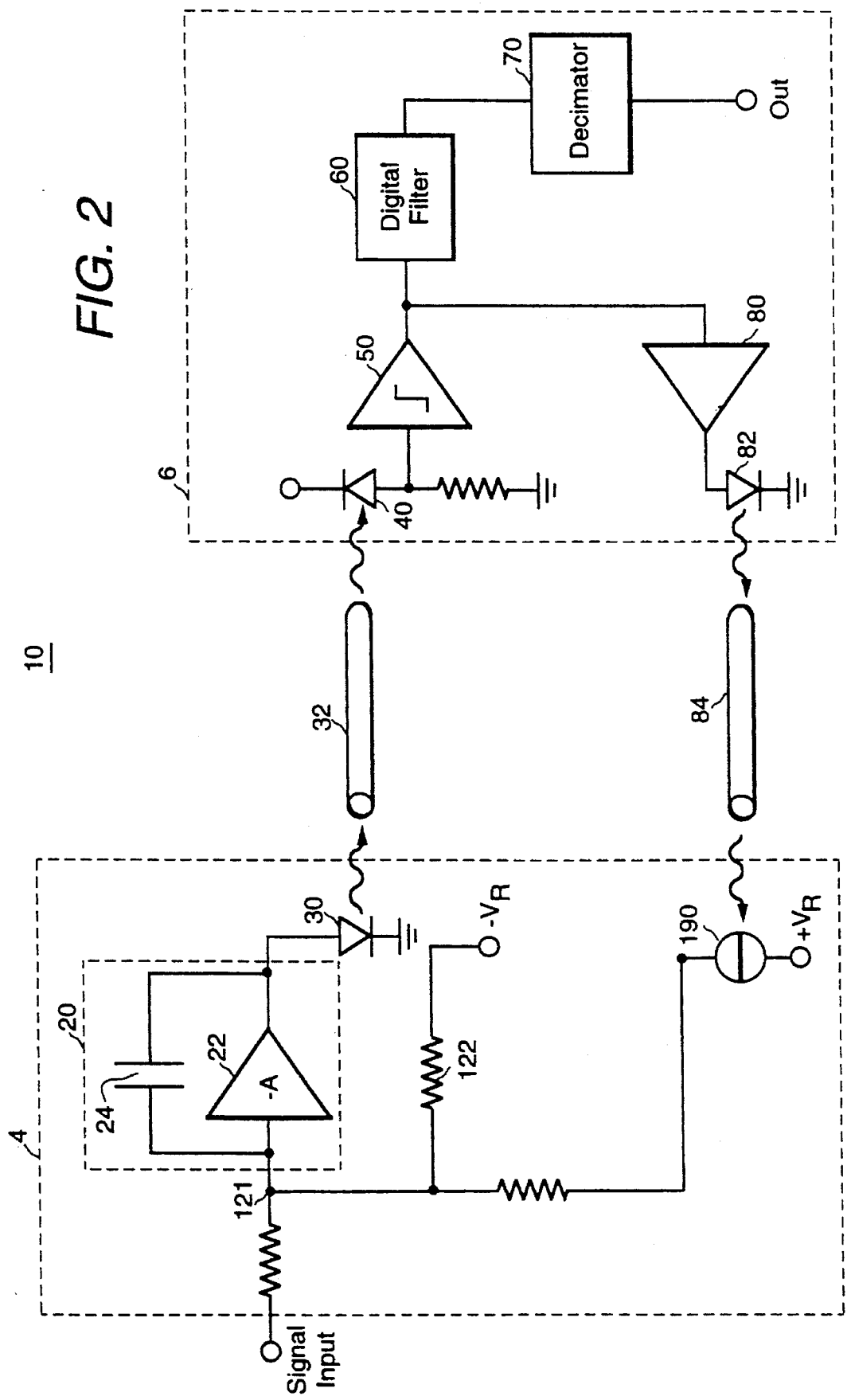
FIG. 2 is a schematic diagram of an alternative embodiment of a distributed A/D converter architecture according to the present invention.

In the alternative embodiment shown in FIG. 2, the number of fibers in the D/A feedback loop is reduced from two to one by connecting one reference voltage, for example $-V_R$, to summing node 121 of integrator 20 through a resistor 122 and using a single photoconductor 190 with an ON resistance of much lower ohmic value than that of resistor 122 to connect to the other reference voltage, for example $V_R$. It will be understood that these voltage references may be reversed, such that $V_R$ is connected to summing node 121 and $-V_R$ is connected to photoconductor 190.

Therefore, in the embodiment of FIG. 2, when the single LED 82 in the feedback path is dark, the first reference voltage ($-V_R$ as illustrated in FIG. 2) is applied to summing node 121 as the feedback voltage, while the second reference voltage ($V_R$ as illustrated in FIG. 2) is applied to summing node 121 as the feedback voltage when LED 82 is lit and the photoconductor is illuminated.

Figure 3:
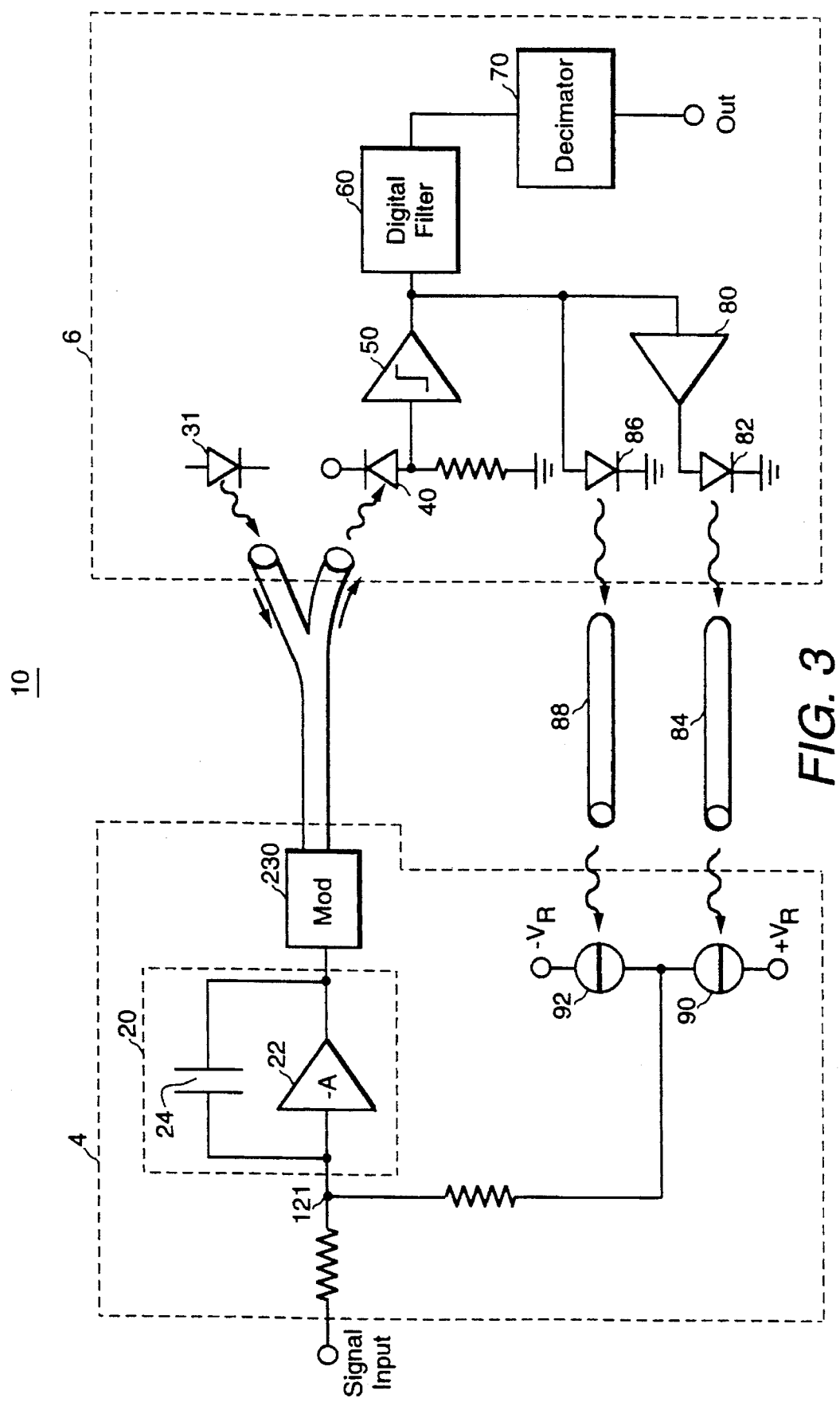
FIG. 3 is a schematic diagram of another alternative embodiment of a distributed A/D converter architecture according to the present invention.

In still another embodiment of the invention as shown in FIG. 3, a capacitive electro-optic modulator 230 is used at the output of integrating op-amp 22 to modulate a light beam originating at a light source 31 in console 6 instead of at LED 30 in probe 4 as shown in the embodiments of FIGS. 1 and 2. A modulator 230 may be substituted for LED 30 in the embodiments illustrated in FIGS. 1 and 2. This has the advantage that the power normally required by LED 30 can be moved off the probe. Additionally, the capacitance of the modulator imposes no penalty, since it becomes part of the op-amp 22 load (which is already capacitive).

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A distributed delta sigma analog-to-digital (A/D) converter, comprising:

an ultrasonic probe including integrator means for receiving an analog input signal and generating an integrated analog output signal in response thereto, first light generating means responsive to the integrated analog output signal for converting said integrated analog output signal to a first light beam, and means for coupling a plurality of reference voltages to an input summing node of the integrator means;

an imaging console; and a plurality of fiber optic cables linking said probe and said console in optical communication with each other, said console including first light responsive means for receiving the first light beam via a first one of said fiber optic cables and converting said first light beam to an analog electrical signal, an internal A/D converter coupled to the first light responsive means for converting said analog electrical signal to a digital signal, and second and third light generating means responsive to said digital signal, each of said second and third light generating means being optically coupled to second and third ones of said fiber optic cables for controlling application of said plurality of reference voltages to said input summing node of said integrator means.

2. The delta sigma A/D converter of claim 1, including first and second photoconductive switches responsive, respectively, to said second and third light generating means and coupled to said input summing node of said integrator means for selectively applying a positive or a negative reference voltage to said input summing node.

3. The delta sigma A/D converter of claim 1 wherein each of the first, second and third light generating means comprises a light emitting diode (LED), respectively.

4. The delta sigma A/D converter of claim 1 wherein the first light generating means comprises a capacitive electro-optic modulator for modulating a light beam from said imaging console, and wherein each of said second and third light generating means comprises an LED, respectively.

5. The delta sigma A/D converter of claim 1, wherein the integrator comprises an operational amplifier having an input and an output, and a capacitor coupling said integrator output to said integrator input.

6. The delta sigma A/D converter of claim 1 wherein the imaging console further comprises digital filter means coupled to said internal A/D converter for filtering the digital signal produced by said internal A/D converter, and a decimator coupled to said digital filter means for sampling the filtered digital output signal at a compressed rate.

7. A distributed delta sigma analog-to-digital (A/D) converter, comprising:

an ultrasonic probe including integrator means for receiving an analog input signal and generating an integrated analog output signal in response thereto, first light generating means responsive to the integrated analog output signal for converting said integrated analog output signal to a first light beam, and means for coupling a plurality of reference voltages to an input summing node of the integrator means;

an imaging console; and first and second fiber optic cables linking said probe and said console in optical communication with each other, said console including first light responsive means for receiving the first light beam via said first fiber optic cable and for converting said first light beam to an analog electrical signal, an internal A/D converter coupled to the first light responsive means for converting said analog electrical signal to a digital signal, and second light generating means responsive to said digital signal and coupled to said second fiber optic cable for controlling application of the plurality of reference voltages to said input summing node of said integrator means.

8. The delta sigma A/D converter of claim 7 wherein the plurality of voltage reference input means includes a photoconductive switch and a resistor respectively connected to a positive and a negative reference voltage.

9. The delta sigma A/D converter of claim 7 wherein each of the first and second light generating means comprises a light emitting diode (LED), respectively.

10. The delta sigma A/D converter of claim 7 wherein the first light generating means comprises a capacitive electro-optic modulator for modulating a light beam from said imaging console, and said second light generating means comprises an LED.

11. The delta sigma A/D converter of claim 7 wherein the integrator comprises an operational amplifier having an input and an output, and a capacitor coupling said integrator output to said integrator input.

12. The delta sigma A/D converter of claim 7 wherein the imaging console further comprises digital filter means coupled to said internal A/D converter for filtering the digital output signal produced by said internal A/D converter, and a decimator coupled to said digital filter means for sampling the filtered digital output signal at a compressed rate.

13. The delta sigma A/D converter of claim 7 including a photoconductive switch responsive to said second light generating means for selectively applying a reference voltage of predetermined polarity to said input summing node, and resistive means for applying a reference voltage of polarity opposite said predetermined polarity to said input summing node, said resistive means being of a higher ohmic value than that of said photoconductive switch when said switch is in an ON condition.

* * * * *